United States Patent [19]
Greenwood et al.

[11] Patent Number: 5,647,123
[45] Date of Patent: Jul. 15, 1997

[54] METHOD FOR IMPROVING DISTRIBUTION OF UNDERFILL BETWEEN A FLIP CHIP DIE AND A CIRCUIT BOARD

[75] Inventors: Jonathon G. Greenwood, Boynton Beach; James G. Lance, Jr., Lake Worth; Robert Kenneth Doot, Boynton Beach, all of Fla.

[73] Assignee: Motorola, Inc., Schaumburg, Ill.

[21] Appl. No.: 543,543

[22] Filed: Oct. 16, 1995

[51] Int. Cl.$^6$ ...................................................... H05K 3/34
[52] U.S. Cl. .................. 29/840; 29/832; 174/260; 257/787
[58] Field of Search .................. 29/832, 840; 174/260; 257/787

[56] References Cited

U.S. PATENT DOCUMENTS 5,162,613  11/1992  Schoenthaler ................. 29/832 X
5,203,076  4/1993  Banesji et al. .................. 29/840
5,218,234  6/1993  Thompson et al. .
5,245,750  9/1993  Crumly et al. .

*Primary Examiner*—Carl J. Arbes
*Attorney, Agent, or Firm*—Keith A. Chanroo; R. Louis Breeden

[57] ABSTRACT

A method and apparatus improves a distribution of an underfill material (504) applied between a flip chip die (202) and a circuit board (310) at a flip chip site (302) having a solder mask (308). An aperture (304) is formed (806) in the solder mask (308) by removing a predetermined majority of the solder mask (308) from the circuit board (310) within the flip chip site (302) before mounting the flip chip die (202). Then the flip chip die (202) is mounted (810) to the flip chip site (302). The underfill material (504) is then applied (812, 814, 816) such that the underfill material (504) flows into the aperture (304), thus improving the distribution of the underfill material (504).

6 Claims, 5 Drawing Sheets

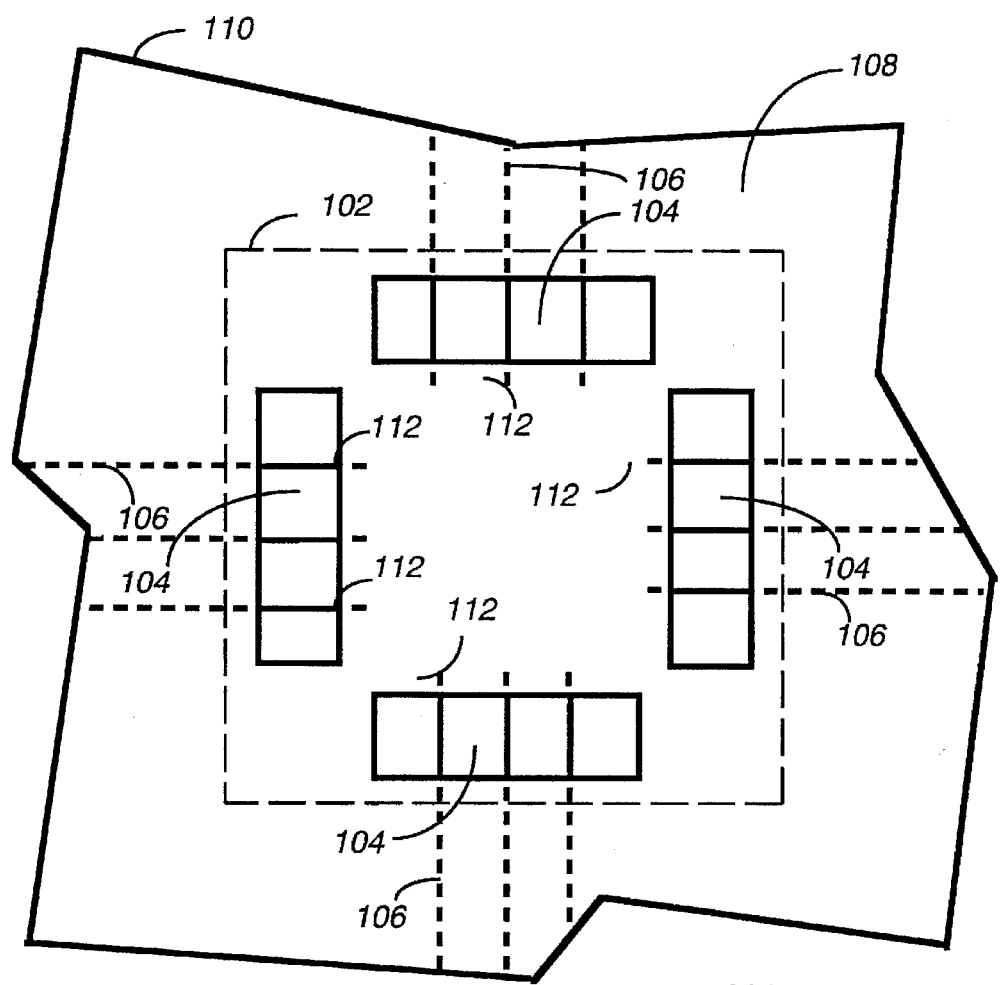
PRIOR ART FIG. 1
PRIOR ART FIG. 2

5,647,123

METHOD FOR IMPROVING DISTRIBUTION OF UNDERFILL BETWEEN A FLIP CHIP DIE AND A CIRCUIT BOARD

RELATED APPLICATION

U.S. Ser. No. 08/517,977, filed Aug. 22, 1995 by Lance et al., entitled "Flip Chip Underfill Needle Injection Technique."

1. Field of the Invention

This invention relates in general to mounting arrangements for flip chip dies, and more specifically to a method and apparatus for improving distribution of an underfill material between a flip chip die and a circuit board.

2. Background of the Invention

Flip chip technology is well known. A conventional circuit board utilizing this technology includes a flip chip site having a solder mask that masks all portions of the site except for portions of circuit runners which are to be connected to contact pads on the flip chip die through a reflow soldering process. Following the reflow soldering process an underfill material is applied between the flip chip die and the circuit board solder mask. The purpose of the underfill material is to prevent detachment of the contact pads from the runners, which can result from temperature cycling of the circuit board, because of the very different coefficients of thermal expansion for the circuit board and the flip chip die.

As flip chips have become smaller and contact pad density greater, smaller solder "bumps" have been required for the reflow soldering process to prevent shorting of the pads and runners. The smaller bumps have caused the clearance between the flip chip die and the circuit board to decrease. The decreased clearance has introduced a new problem: the underfill material cannot flow as well through the decreased clearance, and undesirable voids often occur in the underfill material. Such voids can severely impede the ability of the underfill material to prevent detachment of the contact pads from the runners during temperature cycling.

Thus, what is needed is a method and apparatus for improving the distribution of the underfill material between a flip chip die and a circuit board, thereby minimizing the occurrence of the undesirable voids.

SUMMARY OF THE INVENTION

An aspect of the present invention is a method for improving a distribution of an underfill material applied between a flip chip die and a circuit board at a flip chip site having a solder mask. The method comprises the steps of forming an aperture in the solder mask by removing a predetermined majority of the solder mask from the circuit board within the flip chip site before mounting the flip chip die, and mounting the flip chip die to the flip chip site. The method further comprises the step of thereafter applying the underfill material such that the underfill material flows into the aperture, thereby improving the distribution of the underfill material.

Another aspect of the present invention is a flip chip mounting arrangement having an improved distribution of an under fill material at a flip chip site. The mounting arrangement comprises a circuit board, and a solder mask applied to the flip chip site and having an aperture formed therein by removal of a predetermined majority of the solder mask from the circuit board within the flip chip site. The flip chip mounting arrangement further comprises a flip chip die mounted to the flip chip site, and the underfill material, applied between the flip chip die and the circuit board such that the underfill material has flowed into the aperture.

BRIEF DESCRIPTION OF THE DRAWINGS

FIG. 1 is a top plan view of a portion of a prior art circuit board comprising a conventional flip chip site before mounting a flip chip die thereto.

FIG. 2 is a side elevation view of a prior art mounting arrangement comprising the portion of the prior art circuit board and a mounted flip chip die.

DETAILED DESCRIPTION OF THE DRAWINGS

Figure 3:
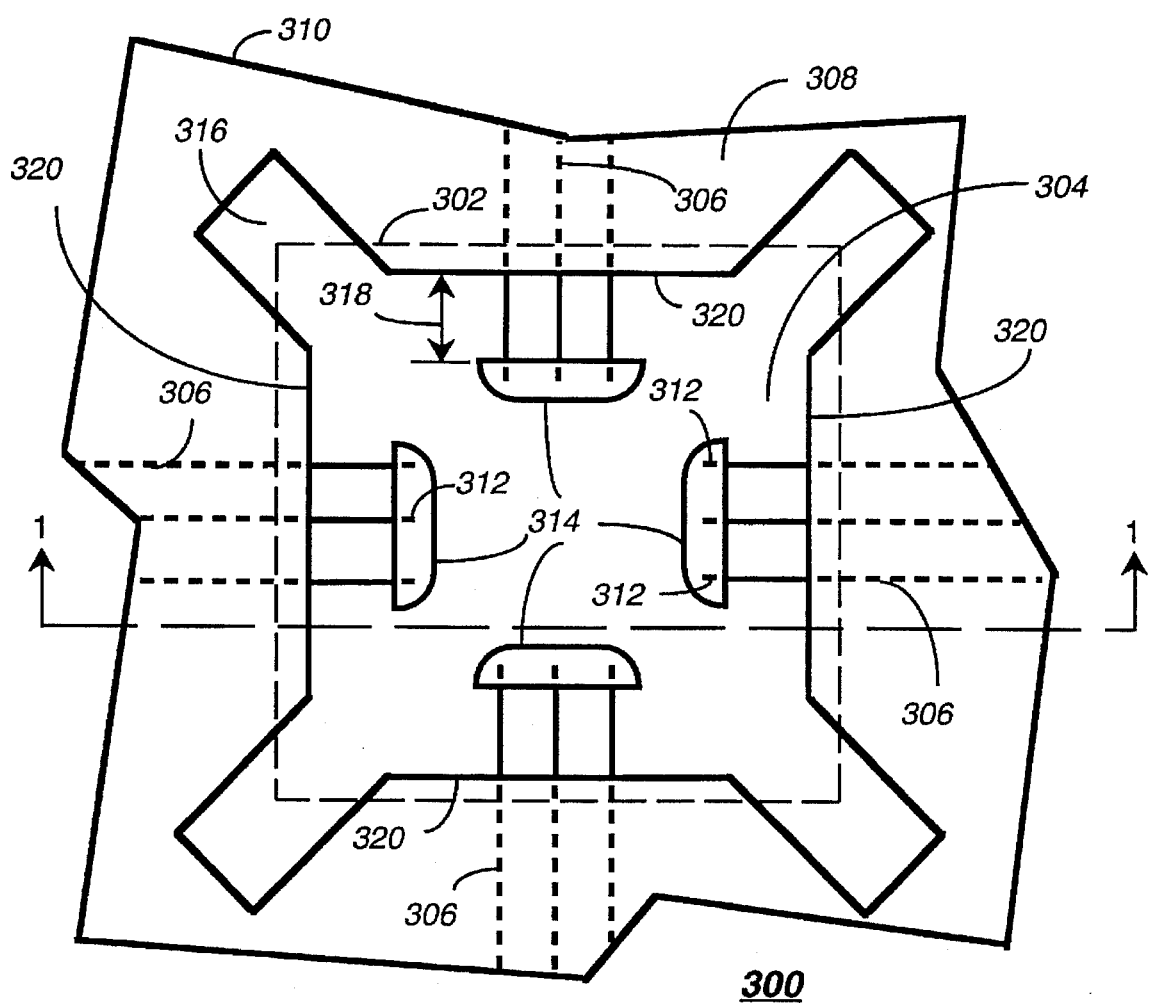
FIG. 3 is a top plan view of a portion of a circuit board comprising a flip chip site in accordance with the preferred embodiment of the present invention, before mounting a flip chip die thereto.

Referring to FIG. 1, a top plan view of a portion 100 of a prior art circuit board 110 comprising a conventional flip chip site 102 before mounting a conventional flip chip die 202 (FIG. 2) thereto depicts the circuit board 110 having a solder mask 108 applied thereto. The solder mask 108 has formed therein four apertures 104 which expose portions of runners 106 to which contact pads of the flip chip die 202 are to be mechanically and electrically attached during a reflow soldering process for mounting the die to the conventional flip chip site 102. Terminating ends 112 of the runners 106 are not exposed, but are masked by the solder mask. The purpose of the solder mask on either side of the exposed portions of the runners 106 is to control the amount of each runner 106 that is "wet" by solder from the flip chip die 202 during the reflow soldering process.

Referring to FIG. 2 a side elevation view of a prior art mounting arrangement 200 comprising the portion 100 of the prior art circuit board 110 and a mounted flip chip die 202 depicts a clearance 204 between the mounted flip chip die 202 and the solder mask 108 before the underfill material is applied. Because the solder bumps utilized on the flip chip die 202 are preferably no more than 0.08 mm in diameter to minimize electrical shorts, the clearance 204 after the reflow soldering process is quite small (about 0.025 mm). Unfortunately, such a small clearance 204 restricts the flow of the under fill material between the flip chip die 202 and the circuit board/solder mask 110, 108, causing voids in the underfill material to form during application thereof. As explained herein above, voids in the underfill material are undesirable and can cause detachment of the contact pads of the flip chip die 202 from the runners 106 when the prior art mounting arrangement 200 is temperature cycled.

Referring to FIG. 3, a top plan view (not drawn to scale) depicts a portion 300 of a circuit board 310, preferably manufactured of FR4 epoxy glass material, comprising a flip chip site 302 of rectangular shape in accordance with the preferred embodiment of the present invention, before mounting of the flip chip die 202 thereto. The view further depicts a substantially rectangular aperture 304 formed in the solder mask 308 of the circuit board 310 and having edges 320 parallel to and proximate corresponding edges of the flip chip site 302. Preferably, the solder mask is a conventional acrylic modified epoxy material. The substantially rectangular aperture 304 preferably is enlarged by additional diagonal channels 316 which extend beyond the flip chip site 302 at the four corners of the flip chip site 302 and are contiguous with the substantially rectangular aperture 304. It will be appreciated that, alternatively, the additional diagonal channels 316 can be omitted, or that the shape of the channels can differ from that depicted in FIG. 3.

Conventional runners 306 of copper are provided for interconnecting mechanically and electrically with contact pads (not shown) on the underside of the flip chip die 202 after a reflow solder process is performed in a manner well known in the art. Preferably, the runners are 0.1 mm in width. Preferably, the die is pre-bumped with 63/37 tin-lead eutectic solder balls of 0.08 mm diameter, prior to the reflow solder process. It will be appreciated that, alternatively, other runner widths, solder mixes, and ball diameters can be utilized for the runners 306 and the solder bumps, depending upon the geometry of the contact pads of the flip chip die 202. It also will be appreciated that, alternatively, other similar materials can be utilized for the circuit board 310 and the solder mask 308.

The flip chip site 302 comprises groups of the runners 306, each group crossing one of the four edges of the flip chip site 302, and each group having terminating ends 312 within the flip chip site that form a row near the corresponding one of the four edges. Islands 314 of unremoved solder mask have been left in the substantially rectangular aperture 304, such that the islands 314 mask the terminating ends 312 of the groups of the runners 306. The islands 314 preferably are D-shaped, the straight side controlling the length 318 of the runners 306 allowed to be wet by the solder during the reflow soldering process, and the curved side aiding free flow of the underfill material 504 (FIG. 5) throughout the aperture 304 after application of the underfill material 504. Preferably, the length 318 is about 150 percent of the width of the runners 306, e.g., 0.15 mm. Preferably, the underfill material 504 is a conventional anhydride epoxy. It will be appreciated that, alternatively, other similar underfill materials can be utilized as well; and other shapes can be used for the islands 314, consistent with adequate control of the length 318 of the runners 306 desired to be wet by the solder. It will be further appreciated that the runners 306 alternatively can be of staggered length and the islands 314 appropriately staggered to match the correspondingly staggered terminating ends 312.

Figure 4:
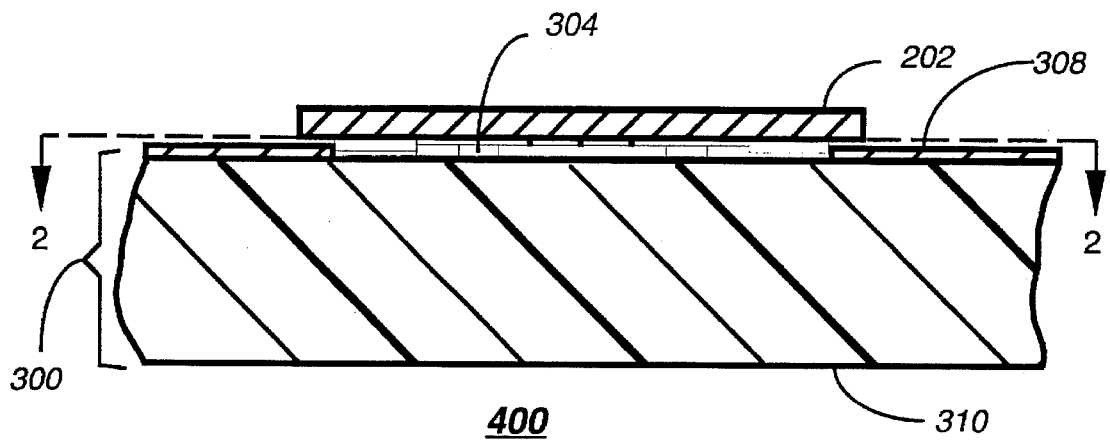
FIG. 4 is a cross-section view, along the line 1—1 of FIG. 3, of a flip chip mounting arrangement comprising the portion of the circuit board in accordance with the preferred embodiment of the present invention, and a mounted flip chip die.

Referring to FIG. 4, a cross-section view, along the line 1—1 of FIG. 3, depicts a flip chip mounting arrangement 400 comprising the portion 300 of the circuit board 310 in accordance with the preferred embodiment of the present invention, and the mounted flip chip die 202 having a rectangular shape. Note that the aperture 304 formed by the removal of a majority of the solder mask 308 from the circuit board 310 within the flip chip site 302 advantageously increases the clearance between the flip chip die 202 and the circuit board 310 within the flip chip site 302. Preferably, after the reflow soldering process, the clearance between the flip chip die 202 and the remaining areas of the solder mask 308 within the flip chip site 302 is approximately 0.025 mm. The solder mask 308 is preferably also approximately 0.025 mm thick. Thus, the aperture 304 in accordance with the preferred embodiment of the present invention approximately doubles the clearance between the flip chip die 202 and the circuit board 310 within most of the flip chip site 302. Tests have determined that the additional clearance provided by the aperture 304 substantially reduces the formation of voids in the underfill material 504 during the application thereof, thereby advantageously improving the reliability of the flip chip mounting arrangement 400 in accordance with the present invention over that of prior art flip chip mounting arrangements.

Figure 5:
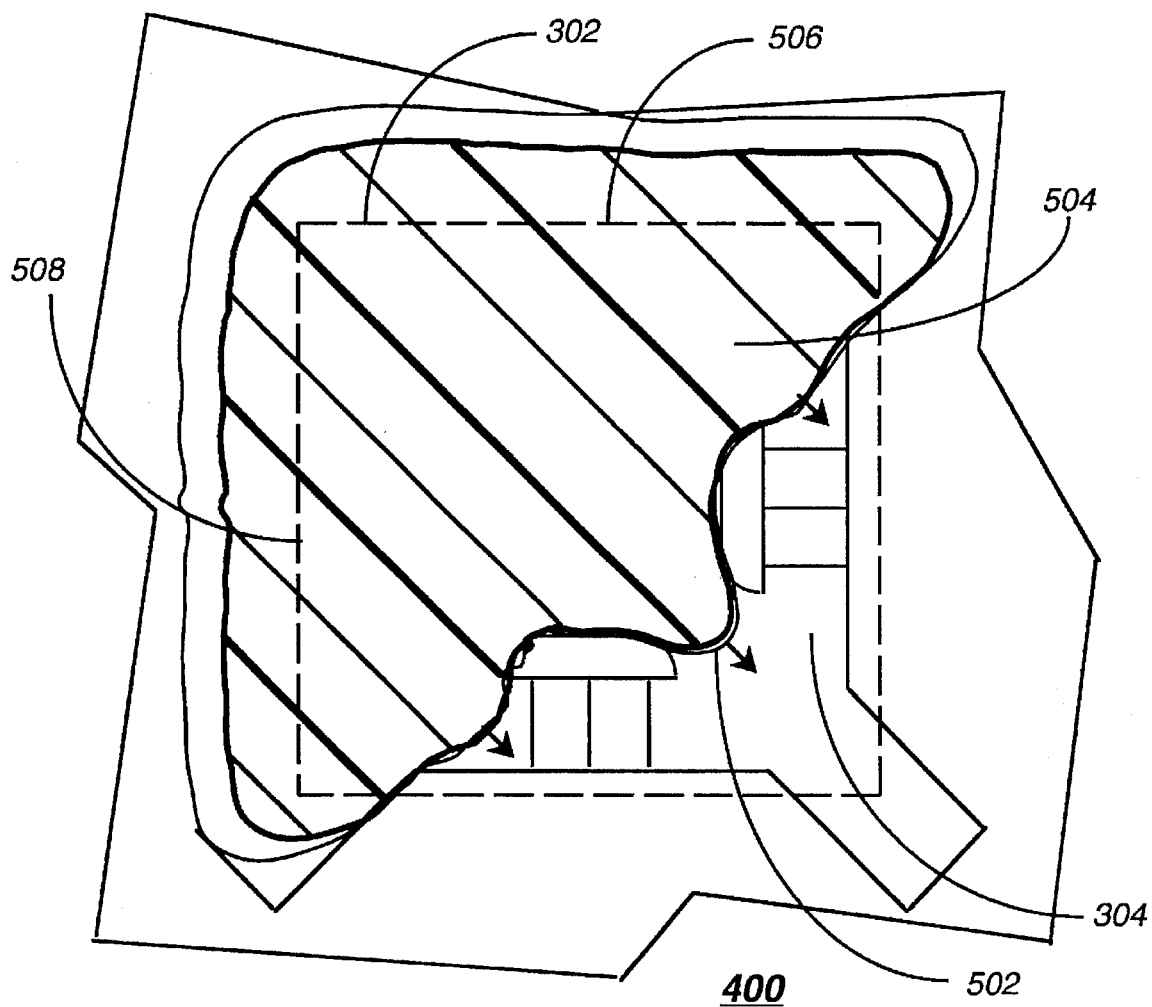
FIG. 5 is a cross-section view, along the line 2—2 of FIG. 4, of the flip chip mounting arrangement in accordance with the preferred embodiment of the present invention depicting a partially applied underfill material.
Figure 6:
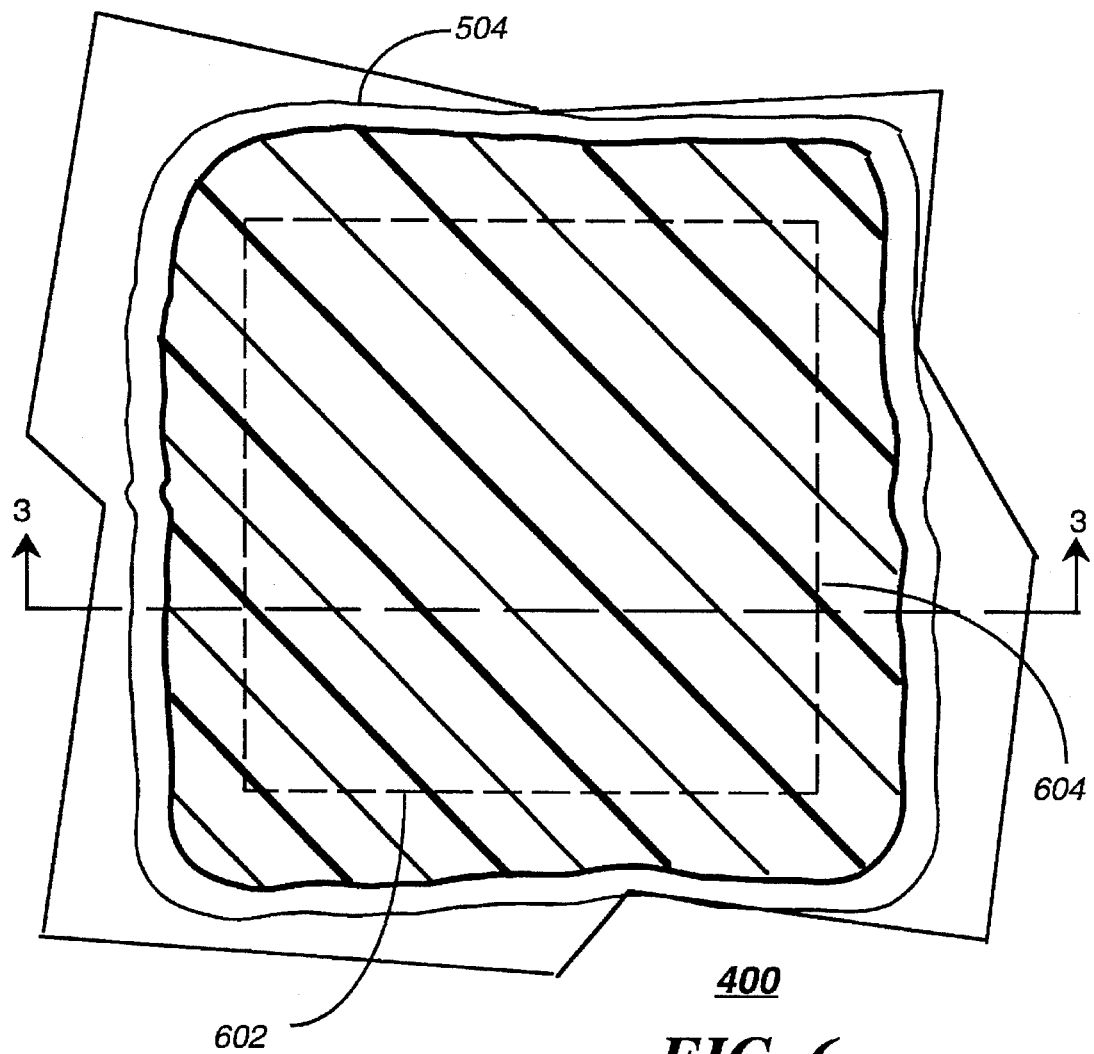
FIG. 6 is a cross-section view, along the line 2—2 of FIG. 4, of the flip chip mounting arrangement in accordance with the preferred embodiment of the present invention depicting a fully applied underfill material.

Referring to FIGS. 5 and 6, cross-section views, along the line 2—2 of FIG. 4, depict the flip chip mounting arrangement 400 in accordance with the preferred embodiment of the present invention having partially applied (FIG. 5) and fully applied (FIG. 6) underfill material 504. Application of the underfill material 504 preferably begins with disposing the underfill material 504 between the flip chip die 202 and the circuit board 310 by applying the underfill material 504 along a first edge 506 of the flip chip die 202, followed by applying the underfill material 504 along a second edge 508 of the flip chip die 202, the second edge 508 adjacent to the first edge 506. Next, the process waits for a predetermined time, e.g., 80 seconds, for the flow front 502 of the just applied underfill material 504 to flow thoroughly into the aperture 304. Then the application process continues with a disposition of the underfill material 504 to form a fillet along the circuit board 310 and the flip chip die 202 by applying the underfill material along a third edge 602 of the flip chip die 202 followed by a fourth edge 604 of the flip chip die 202. Finally, circuit board 110 is passed through a conventional oven to cure and harden the underfill material 504.

Figure 7:
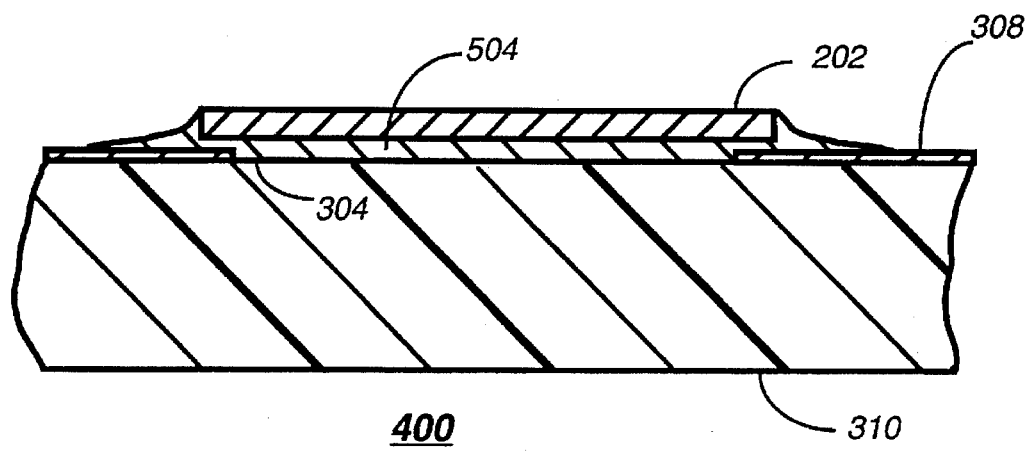
FIG. 7 is a cross-section view, along the line 3—3 of FIG. 6, of the flip chip mounting arrangement depicting the fully applied underfill material in accordance with the preferred embodiment of the present invention.

Referring to FIG. 7, a cross-section view, along the line 3—3 of FIG. 6, depicts the flip chip mounting arrangement 400 having the fully applied underfill material 504 in accordance with the preferred embodiment of the present invention. Note that the aperture 304 has filled evenly with the underfill material 504, thereby improving the distribution of the underfill material 504 in comparison with the distribution achieved by prior art methods.

Figure 8:
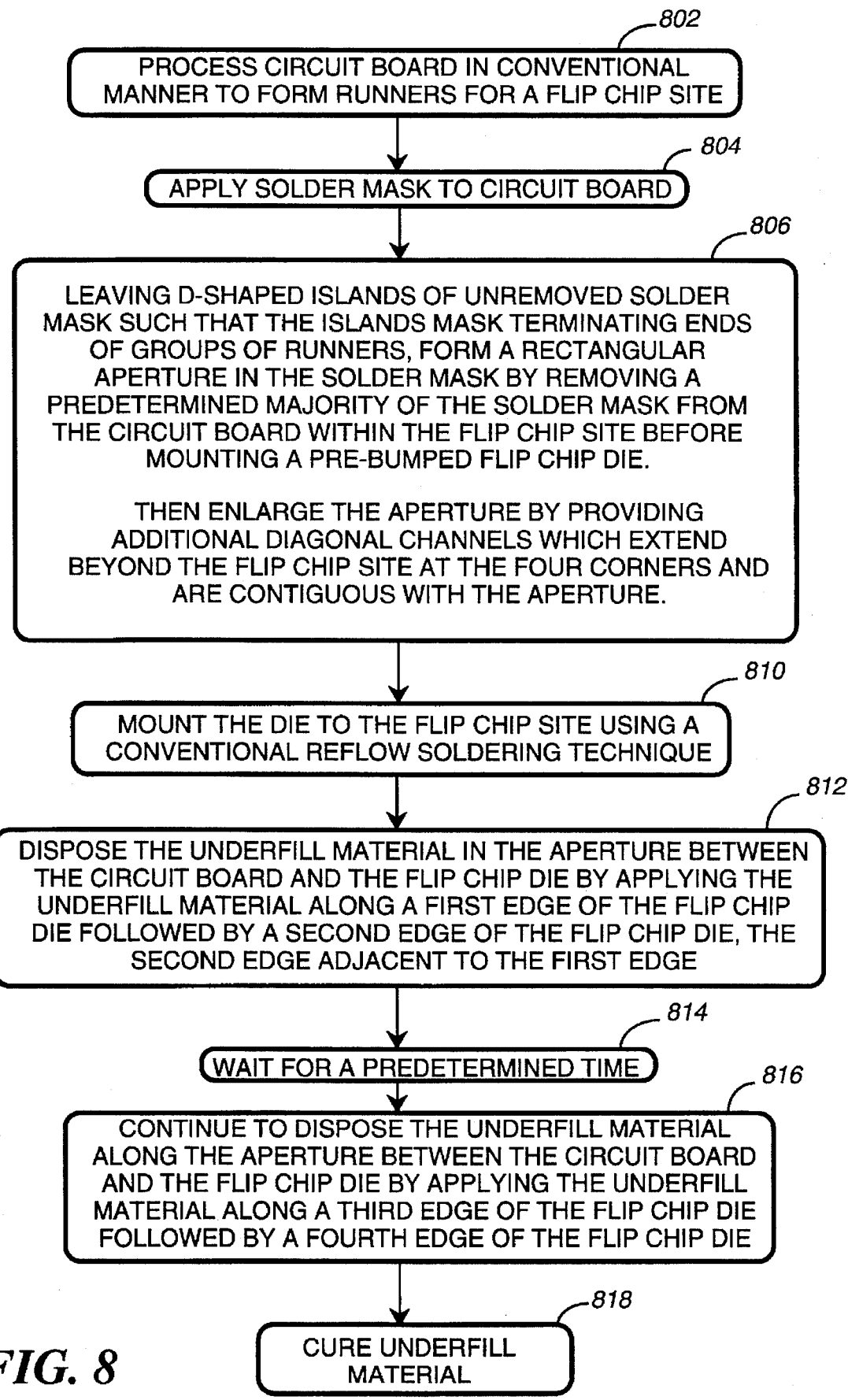
FIG. 8 is a process chart depicting processing of the circuit board in accordance with the preferred embodiment of the present invention.

FIG. 8 is a process chart depicting processing of the circuit board 310 in accordance with the preferred embodiment of the present invention. First, in step 802 the circuit board 310 is processed in a conventional manner to form the runners 306 for the flip chip site 302. In step 804, the solder mask 308 is applied to the circuit board 310 in a conventional manner. In step 806 the circuit board 310 with the solder mask 308 is photo etched to form the rectangular aperture 304, while leaving the D-shaped islands 314, in accordance with the present invention. In the same photo etch process, the aperture 304 preferably is enlarged to include the four additional diagonal channels 316 which extend beyond the flip chip site 302 at the four corners and are contiguous with the aperture 304. The four additional diagonal channels 316 are for further facilitating the flow of the underfill material 504 when it is applied to the flip chip site 302.

In step 810, the (pre-bumped) flip chip die 202 is mounted to the flip chip site 302 using a conventional reflow soldering technique well known in the art. In step 812, the underfill material 504 is disposed between the circuit board 310 and the flip chip die 202 by applying the underfill material 504 along the first edge 506 of the flip chip die 202 followed by the second edge 508 of the flip chip die 202, the second edge 508 adjacent to the first edge 506. In step 814, the process waits for a predetermined time while the underfill material 504 flows into the aperture 304 and the four additional diagonal channels 316. Then in step 816, the process continues to dispose the underfill material 504 along the aperture between the circuit board 110 and the flip chip die 202 by applying the underfill material 504 along the third edge 602 of the flip chip die 202 followed by the fourth edge 604 of the flip chip die 202. Finally, in step 818, the circuit board 110 is heated in a conventional oven to cure and harden the underfill material 504. Alternatively, the underfill material can be cured by exposure to ultraviolet light.

Thus, it should be apparent by now that the present invention provides a method and apparatus for improving the distribution of the underfill material between a flip chip die and a circuit board, thereby minimizing the occurrence of undesirable voids. The voids are undesirable because voids can result in detachment of the contact pads of the flip chip die from the runners of the circuit board due to temperature induced stresses.

What is claimed is:

1. A method for improving a distribution of an underfill material applied between a flip chip die and a circuit board at a flip chip site having a solder mask, the method comprising the steps of:

forming an aperture in the solder mask by removing a predetermined majority of the solder mask from the circuit board within the flip chip site before mounting the flip chip die;

mounting the flip chip die to the flip chip site; and thereafter applying the underfill material such that the underfill material flows into the aperture, thereby improving the distribution of the underfill material;

wherein the flip chip die is of a rectangular shape comprising four edges which meet at four corners, and wherein the applying step comprises the steps of:

disposing the underfill material between the circuit board and the flip chip die by applying the underfill material along a first edge of the flip chip die followed by a second edge of the flip chip die, the second edge adjacent to the first edge;

thereafter waiting for a predetermined time; and subsequently continuing to dispose the underfill material between the circuit board and the flip chip die by applying the underfill material along a third edge of the flip chip die followed by a fourth edge of the flip chip die.

2. The method of claim 1, wherein a first clearance exists between the flip chip die and the solder mask after the mounting step, and wherein a second clearance exists between the flip chip die and the circuit board where the aperture is present, and wherein the second clearance is approximately double the first clearance.

3. The method of claim 1, wherein the flip chip site is of a rectangular shape comprising four edges which meet at four corners, and wherein the forming step comprises the step of providing a substantially rectangular aperture having edges parallel to and proximate the four edges of the flip chip site.

4. The method of claim 3, wherein the forming step further comprises the step of enlarging the substantially rectangular aperture by providing additional diagonal channels which extend beyond the flip chip site at the four corners and are contiguous with the substantially rectangular aperture.

5. The method of claim 4, wherein the flip chip site comprises groups of runners, each group crossing a corresponding one of the four edges of the flip chip site, and each group having terminating ends within the flip chip site that form a row substantially parallel to the corresponding one of the four edges, and wherein the forming step further comprises the step of leaving islands of unremoved solder mask in the aperture, such that the islands mask the terminating ends of the groups of runners.

6. The method of claim 5 wherein each of the islands is D-shaped.

* * * * *